United States Patent
Hung et al.

(10) Patent No.: US 6,639,251 B1
(45) Date of Patent: Oct. 28, 2003

(54) LIGHT EMITTING ELEMENT ARRAY MODULE AND PRINTER HEAD AND MICRO-DISPLAY USING THE SAME

(75) Inventors: Chien-chen Hung, Hsinchu (TW); Huai-ku Chung, Hsinchu (TW); Shih-han Yu, Hsinchu (TW)

(73) Assignee: Opto Tech Corporation, Hsinchu (TW)

( * ) Notice: Subject to any disclaimer, the term of this patent is extended or adjusted under 35 U.S.C. 154(b) by 0 days.

(21) Appl. No.: 10/350,477

(22) Filed: Jan. 24, 2003

(30) Foreign Application Priority Data

Oct. 14, 2002 (TW) .......................... 91123647 A

(51) Int. Cl.[7] .............................................. H01L 33/00
(52) U.S. Cl. ................................ 257/99; 257/81; 257/88
(58) Field of Search ................................ 257/99, 79, 81, 257/82, 88, 98, 773, 786

*Primary Examiner*—Mark V. Prenty
(74) *Attorney, Agent, or Firm*—Law Offices of David Pai; Chao-Chong David Pai

(57) ABSTRACT

A light emitting element array module includes a board; a silicon base having a first side, a second side opposite to the first side and adhered to the board, a third side having a first angle with the second side, a fourth side substantially in parallel with the first side and having a second angle with the third side, and a fifth side having a third angle with the fourth side; a chip having a first main surface formed with at least one light emitting element array and at least one pad array, and a second main surface adhered to the board; a driving device adhered to the first side of the silicon base; and a plurality of metal wires for connecting the pad array to the driving device.

20 Claims, 3 Drawing Sheets

LIGHT EMITTING ELEMENT ARRAY MODULE AND PRINTER HEAD AND MICRO-DISPLAY USING THE SAME

BACKGROUND OF THE INVENTION

1. Field of the Invention

The invention relates to a light emitting element array module and a printer head and a micro-display using the module.

2. Description of the Related Art

Light emitting diode (LED) arrays are widely used in printer heads of printing machines or copying machines. A typical LED printer head includes an LED unit, an optical element for focusing light rays emitted from the LED unit, and a support portion for holding the LED unit and the optical element. As shown in FIGS. 1 and 2, a conventional LED unit includes a printed circuit board 1, a plurality of LED array chips 2 and a plurality of driving devices 3. The LED array chips 2 are connected with one another to achieve a required length for the printer head and are mounted on a component surface of the printed circuit board 1. The driving devices 3 are disposed in a row on the component surface of the printed circuit board 1 and in parallel with the LED array chips 2. Each driving device 3 is electrically connected to one of the LED array chips 2 by bonding wires 4, and to conductive patterns 5 on the printed circuit board 1 by bonding wires 6.

In the LED array chip 2, each LED emitting area 20 is very small, and the density of the LED emitting areas 20 is high. For example, if a resolution of 600 dpi is to be achieved, about 5000 sites of the LED emitting areas 20 must be formed on one chip 2. Then, a wire bonding process must be performed for each bonding pad 21. That is, the wire bonding process must be performed for about 5,000 times to form the bonding wires 4. In this case, since the number and the density of the bonding wires 4 are so large that the manufacturing process becomes difficult, resulting problems such as a lowered yield and an increased manufacturing cost.

SUMMARY OF THE INVENTION

To solve the above-mentioned problems, the invention provides a light emitting element array module including: a board; a silicon base having at least a first side, a second side, a third side, a fourth side and a fifth side, wherein the second side is opposite to the first side and has a first included angle with the third side, the fourth side is substantially in parallel with the first side and has a second included angle with the third side, the fourth side has a third included angle with the fifth side, and the second side is adhered to the board; a chip having a first main surface and a second main surface, wherein on the first main surface is formed with at least one light emitting element array and at least one pad array, the pad array is connected to the fourth side of the silicon base, and the second main surface is adhered to the board; a driving device for driving the at least one light emitting element array, wherein the driving device is adhered to the first side of the silicon base; and a plurality of metal wires each formed on the first, fourth and fifth sides of the silicon base, for connecting the at least one pad array of the chip to the driving device.

According to the light emitting element array module of the invention, the idea of "flip chip bonding" is used instead of a complicated wire bonding process, thereby reducing the manufacturing cost. In addition, in the light emitting direction of the light emitting element array module of the invention, there exists no other elements and thus the light rays emitted from the light emitting element array module are not blocked nor interfered by other elements. Therefore, the light emitting element array module of the invention has both the advantages of low manufacturing cost and excellent light emitting quality.

DESCRIPTION OF THE PREFERRED EMBODIMENTS

Figure 1:
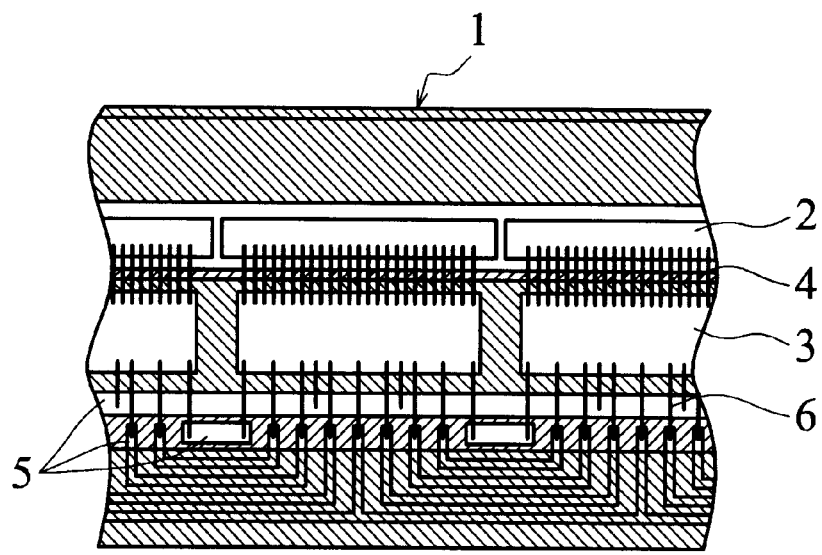
FIG. 1 is a schematic plan view showing a conventional LED unit.
Figure 2:
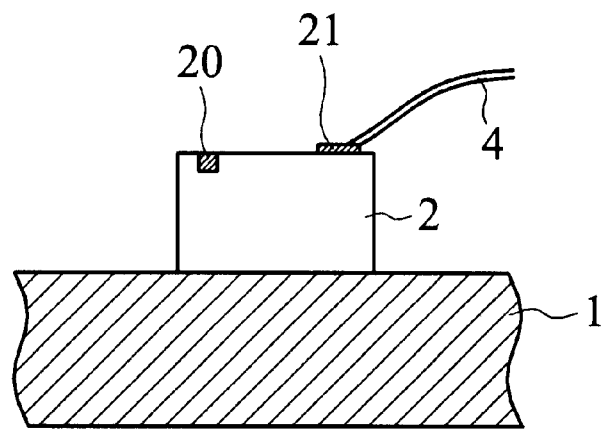
FIG. 2 is a schematic cross-sectional view showing a conventional LED unit.

The preferred embodiments of the invention will be described with reference to the accompanying drawings, wherein the same reference numerals denote the same elements.

Figure 3:
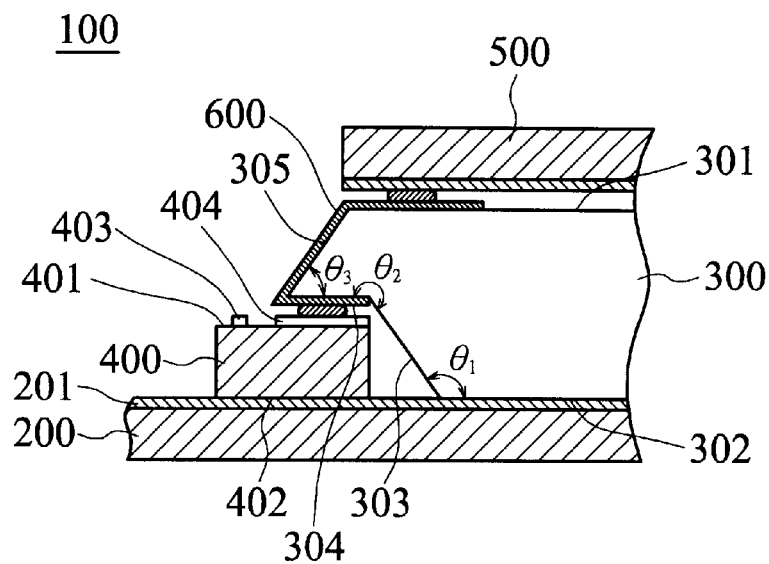
FIG. 3 is a schematic cross-sectional view showing a light emitting element array module in accordance with an embodiment of the invention.

Referring to FIG. 3, a light emitting element array module 100 includes a board 200, a silicon base 300, a chip 400, a driving device 500 and a plurality of metal wires 600. The silicon base 300 has at least a surface 301, a surface 302, a surface 303, a surface 304 and a surface 305. The surface 302 is opposite to the surface 301 and has an included angle $\theta_1$ with the surface 303. The surface 304 is substantially in parallel with the surface 301 and has an included angle $\theta_2$ with the surface 303. The surface 305 and the surface 304 have an included angle $\theta_3$. The surface 302 of the silicon base 300 is adhered to the board 200. The chip 400 has a surface 401 and a surface 402, and on the surface 401 is formed with a light emitting element array 403 and a pad array 404. The pad array 404 is connected with the surface 304 of the silicon base 300. The surface 402 of the chip 400 is adhered to the board 200. The driving device 500 is adhered to the surface 301 of the silicon base 300, for driving the light emitting element array 403. A plurality of metal wires 600 are formed on the surfaces 301, 304 and 305 of the silicon base 300, for connecting the pad array 404 of the chip 400 to the driving device 500.

More specifically, on a surface of the board 200 is coated with an adhesive material 201 so that the silicon base 300 and the chip 400 are not only firmly mounted, but also heat generated therefrom is spread through the adhesive material 201 to the board 200 as a heat sink. Thereby, the light emitting element array module 100 is prevented from rising to a high temperature. It is preferable that the adhesive material 201 is a silver paste with a good thermal conductivity.

It is preferable that the silicon base 300 is formed by (100) silicon. In this case, the included angle $\theta_1$ is greater than 90 degrees and the included angle $\theta_3$ is smaller than 90 degrees.

In addition, the sum of the included angle $\theta_1$ and the included angle $\theta_3$ is 180 degrees. Specifically, it is preferable that the included angle $\theta_3$ of the light emitting element array module 100 in accordance with this embodiment is 54.7 degrees. It is apparent to those skilled in the art that the above-mentioned angles $\theta_1$ to $\theta_3$ can be formed by anisotropic etching of the silicon base 300 made of (100) silicon.

It is preferable that the light emitting element array 403 of the chip 400 has a plurality of light emitting diodes (LEDs), and the pad array 404 is used as outside terminals for the LEDs. In this case, the pad array 404 is connected to the driving device 500 via the metal wires 600 formed on the surfaces 301, 304 and 305 of the silicon base 300, so as to control the light emitting element array 403.

By using the light emitting element array module 100 of this embodiment, even when about 5,000 sites of LEDs are to be formed, the bonding between the light emitting element array 403 and the driving device 500 can be achieved at one time without performing the wire bonding process. Thereby, the manufacturing process is simplified, the yield is increased, and the manufacturing cost is greatly reduced.

In addition, since the vertical distance between the surface 302 and the surface 304 can be adjusted in accordance with the thickness of the chip 400 so that the surface 302 and the surface 402 are at substantially the same horizontal level, the silicon base 300 and the chip 400 can be mounted firmly on the board 200. Thus, the connection between the chip 400 and the driving device 500 can be assured. Also, the thickness of the adhesive material 201 coated on different regions of the board 200 can be adjusted so that the silicon base 300 and the chip 400 are firmly mounted, and the connection between the chip 400 and the driving device 500 is achieved.

Figure 4:
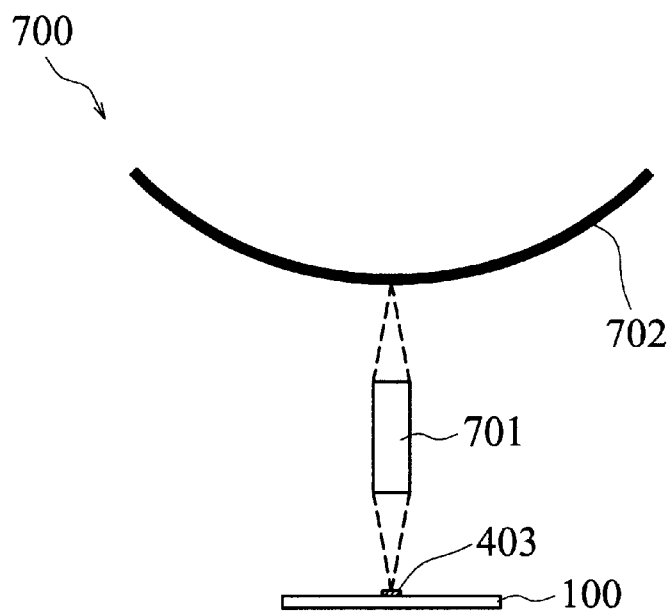
FIG. 4 is a schematic diagram showing an application for the light emitting element array module in accordance with the embodiment of the invention.

The applications of the light emitting element array module 100 in accordance with the embodiment of the invention will be described. First, as shown in FIG. 4, the light emitting element array module 100 of the invention can be used in a printer head as a light source of an optical mechanism 700. By an optical element 701, light rays emitted by the light emitting element array 403 of the light emitting element array module 100 are focused onto an image drum 702. It is preferable that the optical element 701 is a rod lens array.

Figure 5:
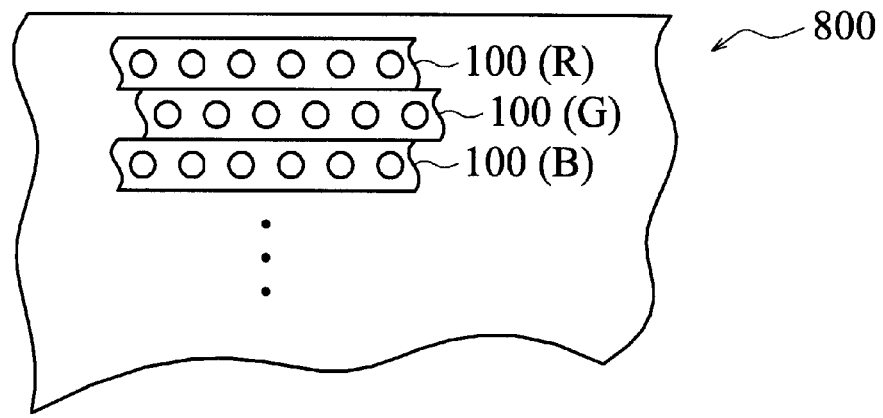
FIG. 5 is a schematic diagram showing another application for the light emitting element array module in accordance with the embodiment of the invention.

Besides, the light emitting element array module 100 of the invention can be used in a micro-display 800. As shown in FIG. 5, a plurality of light emitting element array modules 100 each has a wavelength of R, G, or B are combined to form a "matrix" as a display screen. By sending image signals to each light emitting element array module 100, a required image can be shown.

Figure 6:
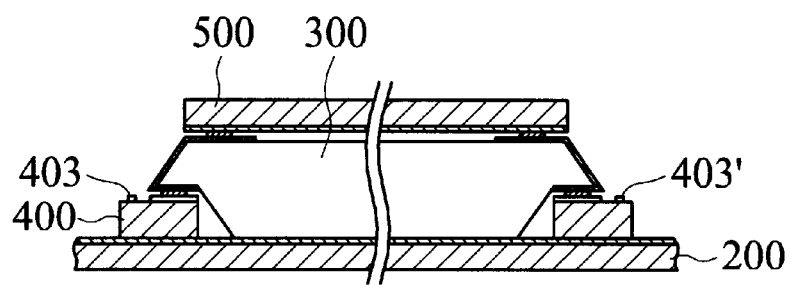
FIG. 6 is a schematic cross-sectional view showing a light emitting element array module in accordance with another embodiment of the invention.

While the invention has been particularly described, in conjunction with a specific embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the invention. For example, although FIG. 3 merely shows that the light emitting element array 403 of the invention is formed on one side of the silicon base 300, the light emitting element array 403 can also be formed on other sides of the silicon base 300. For example, as shown in FIG. 6, another light emitting element array 403' is formed opposite to the light emitting element array 403, thereby doubling the resolution.

What is claimed is:

1. A light emitting element array module comprising:
   a board;
   a silicon base having at least a first side, a second side, a third side, a fourth side and a fifth side, wherein the second side is opposite to the first side and has a first included angle with the third side, the fourth side is substantially in parallel with the first side and has a second included angle with the third side, the fourth side has a third included angle with the fifth side, and the second side is adhered to the board;
   a chip having a first main surface and a second main surface, wherein on the first main surface is formed with at least one light emitting element array and a pad array, the pad array is connected to the fourth side of the silicon base, and the second main surface is adhered to the board;
   a driving device for driving the at least one light emitting element array, wherein the driving device is adhered to the first side of the silicon base; and
   a plurality of metal wires each formed on the first, fourth, and fifth sides of the silicon base, for connecting the pad array of the chip to the driving device.

2. The light emitting element array module according to claim 1, wherein the at least one light emitting element array comprises a plurality of light emitting diodes.

3. The light emitting element array module according to claim 1, wherein the first included angle is greater than 90 degrees, and the third included angle is smaller than 90 degrees.

4. The light emitting element array module according to claim 3, wherein the sum of the first included angle and the third included angle is 180 degrees.

5. The light emitting element array module according to claim 4, wherein the third included angle is 54.7 degrees.

6. The light emitting element array module according to claim 1, wherein the silicon base is made of (100) silicon.

7. The light emitting element array module according to claim 1, wherein the silicon base and the chip are adhered to the board by a silver paste.

8. A printer head comprising:
   a light emitting element array module, as a light source, which includes:
   a board;
   a silicon base having at least a first side, a second side, a third side, a fourth side and a fifth side, wherein the second side is opposite to the first side and has a first included angle with the third side, the fourth side is substantially in parallel with the first side and has a second included angle with the third side, the fourth side has a third included angle with the fifth side, and the second side is adhered to the board;
   a chip having a first main surface and a second main surface, wherein on the first main surface is formed with at least one light emitting element array and a pad array, the pad array is connected to the fourth side of the silicon base, and the second main surface is adhered to the board;
   a driving device for driving the at least one light emitting element array, wherein the driving device is adhered to the first side of the silicon base; and
   a plurality of metal wires each formed on the first, fourth and fifth sides of the silicon base, for connecting the pad array of the chip to the driving device; and
   an optical element for focusing light rays emitted from the at least one light emitting element array of the light emitting element array module.

9. The printer head according to claim 8, wherein the optical element is a rod lens array.

10. The printer head according to claim 8, wherein the first included angle is greater than 90 degrees, and the third included angle is smaller than 90 degrees.

11. The printer head according to claim 10, wherein the sum of the first included angle and the third included angle is 180 degrees.

12. The printer head according to claim 11, wherein the third included angle is 54.7 degrees.

13. The printer head according to claim 8, wherein the silicon base is made of (100) silicon.

14. The printer head according to claim 8, wherein the silicon base and the chip are adhered to the board by a silver paste.

15. A micro-display comprising a plurality of light emitting element array modules each comprising:

a board;

a silicon base having at least a first side, a second side, a third side, a fourth side and a fifth side, wherein the second side is opposite to the first side and has a first included angle with the third side, the fourth side is substantially in parallel with the first side and has a second included angle with the third side, the fourth side has a third included angle with the fifth side, and the second side is adhered to the board;

a chip having a first main surface and a second main surface, wherein on the first main surface is formed with at least one light emitting element array and a pad array, the pad array is connected to the fourth side of the silicon base, and the second main surface is adhered to the board;

a driving device for driving the at least one light emitting element array, wherein the driving device is adhered to the first side of the silicon base; and a plurality of metal wires each formed on the first, fourth and fifth sides of the silicon base, for connecting the pad array of the chip to the driving device, wherein:

the plurality of light emitting element array modules are used as a display screen, which shows a required image by transmitting image signals to each light emitting element.

16. The micro-display according to claim 15, wherein the first included angle is greater than 90 degrees, and the third included angle is smaller than 90 degrees.

17. The micro-display according to claim 16, wherein the sum of the first included angle and the third included angle is 180 degrees.

18. The micro-display according to claim 17, wherein the third included angle is 54.7 degrees.

19. The micro-display according to claim 15, wherein the silicon base is made of (100) silicon.

20. The micro-display according to claim 15, wherein the silicon base and the chip are adhered to the board by a silver paste.

* * * * *